United States Patent

Chudzik et al.

(10) Patent No.: US 6,541,331 B2
(45) Date of Patent: Apr. 1, 2003

(54) METHOD OF MANUFACTURING HIGH DIELECTRIC CONSTANT MATERIAL

(75) Inventors: Michael P. Chudzik, Beacon, NY (US); Lawrence Clevenger, LaGrangeville, NY (US); Louis L. Hsu, Fishkill, NY (US); Deborah A. Neumayer, Danbury, CT (US); Joseph F. Shepard, Jr., Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/924,548

(22) Filed: Aug. 9, 2001

(65) Prior Publication Data

US 2003/0032235 A1 Feb. 13, 2003

(51) Int. Cl.[7] .......................................... H01L 21/8242
(52) U.S. Cl. ........................ 438/240; 438/396; 438/608; 257/410; 257/411
(58) Field of Search ................................ 438/240, 253–7, 438/396, 608, 635, 783–785; 257/410, 411, 406

(56) References Cited

U.S. PATENT DOCUMENTS

| | | | | |
|---|---|---|---|---|
| 6,297,539 B1 | * | 10/2001 | Ma et al. | 257/410 |
| 6,319,766 B1 | * | 11/2001 | Bakli et al. | 438/240 |
| 6,352,865 B2 | * | 3/2002 | Lee et al. | 438/3 |

* cited by examiner

Primary Examiner—David Nelms
Assistant Examiner—Dung Anh Le
(74) Attorney, Agent, or Firm—McGinn & Gibb, PLLC; Marian Underweiser, Esq.

(57) ABSTRACT

A process of forming a high-k dielectric in an integrated circuit structure is disclosed. The process cleans a substrate to remove residual organic materials and strip native oxide from the surface of the substrate. Next, the process introduces precursors on the substrate in molar ratios consistent with formation of dielectric glass films. Following that, the process oxidizes the precursors, heats the precursors, and cools the precursors at a rate that avoids crystallization of the precursors.

12 Claims, 1 Drawing Sheet

METHOD OF MANUFACTURING HIGH DIELECTRIC CONSTANT MATERIAL

BACKGROUND OF THE INVENTION

1. Field of the Invention

The present invention generally relates to the formation of dielectric materials in semiconductor integrated circuits and more particularly to an improved dielectric material and process for forming the same.

2. Description of the Related Art

Current integrated circuit processing technology, such as trench capacitor technology, utilizes thin films of oxidized silicon nitride as the node dielectric responsible for charge storage in the dynamic random access memory (DRAM) cell. As ground rules of the devices continue to shrink however, maintaining the minimum cell capacitance becomes increasingly difficult and to this point, has been achieved via a thinning of the node nitride. An alternative approach is to increase the dielectric constant (k) of the node material via the utilization of an alternative oxide with higher K (e.g. $Ta_2O_5$, $Al_2O_3$, $ZrO_2$, BSTO, etc.). Although higher dielectric constants can be achieved, processing temperatures in excess of 1000° C. are commonly required for such high k-trench capacitor DRAM's. The elevated processing temperatures and extended soak times required at such temperatures commonly result in crystallization of the dielectric and excessive leakage along the resultant grain boundaries.

Therefore, there is a need for an improved dielectric that can be used with conventional semiconductor processing and that does not crystalize at processing temperatures in excess of 1000° C. The invention discussed below presents such a dielectric.

SUMMARY OF THE INVENTION

In view of the foregoing and other problems, disadvantages, and drawbacks of the conventional dielectric materials, the present invention has been devised, and it is an object of the present invention to provide a structure and method for an improved dielectric material. In order to attain the object(s) suggested above, there is provided, according to one aspect of the invention a process of forming a dielectric in an integrated circuit structure that includes introducing precursors on a substrate, oxidizing the precursors and heating the precursors. The introducing and the oxidizing of the precursors is preformed in a manner so as to form an amorphous glass dielectric on the substrate. The process preferably includes, before introducing the precursors on the substrate, cleaning the substrate. The introducing of precursors is performed in molar ratios consistent with formation of glass films and may be achieved using ALCVD or MOCVD (i.e. Atomic layer CVD or Metal-organic CVD) of $La_2O_3$ and $Al_2O_3$ using ratios between 20%–50% $La_2O_3$ and 80%–50% $Al_2O_3$.

The invention produces a dielectric that remains amorphous up to at least 1000° C. and that has a dielectric constant of approximately 20. Therefore, the dielectric produced with the invention remains amorphous at elevated temperatures and thus maintains low electrical leakage via the elimination of grain boundaries.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

Figure 2:
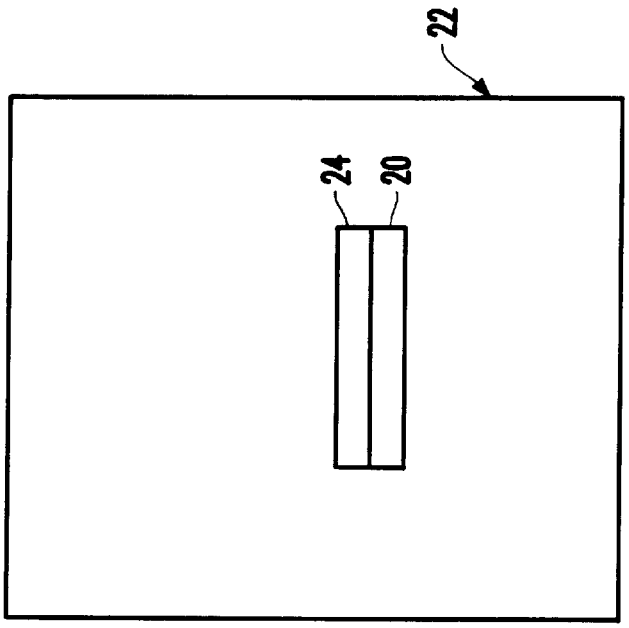
FIG. 2 is a schematic diagram of the integrated circuit structure produced with the invention.

As discussed above, there is a need for an improved dielectric that can be used with conventional semiconductor processing and that does not crystalize at processing temperatures up to 1000° C. In order to maintain the elevated dielectric constant of the material and keep the electrical leakage to a minimum, the invention uses a process to form glass films (i.e. amorphous films) which maintain their non-crystalline structure at the elevated temperatures required in the fabrication of integrated circuit devices, such as deep trench capacitors.

This invention raises the dielectric constant of the node dielectric via the utilization of mixtures of high-K oxides in molar ratios consistent with the formation of glass films. Such films are intended to remain amorphous at elevated temperatures and thus maintain low electrical leakage via the elimination of grain boundaries. For example, in the bulk, $La_2O_3$ and $Al_2O_3$ can be mixed in a ratio of $40La_2O_3 + 60Al_2O_3$ to form a transparent glass with a critical cooling rate of less than 100 K/s. Thus, when deposited from the vapor phase, the cooling rate achieved with the inventive dielectric should be well in excess of the 100 K/s required to keep the glass vitreous (e.g., non-crystalline).

Furthermore, because the dielectric is amorphous a linear mixing law applies, which allows the dielectric constant of the resulting glass to be as great as 20 (the dielectric constants of $La_2O_3$ and $Al_2O_3$ are approximately 30 and 10, respectively) and thus more than a factor of 4 better than oxidized silicon nitride (which has a dielectric constant of approximately 4), and still larger than that of pure $Si_3N_4$ (k~7). Although, the fabrication of a two component glass is preferable from an ease of processing standpoint, it should be noted that the addition of a third or fourth oxide (e.g. $SiO_2$) is possible with the invention and could in fact be beneficial.

Mixing of oxides have been suggested for the fabrication of conventional gate oxides. In such cases, mixed oxides are formed as binary alloys consisting of dilute quantities of some high-k material (e.g. $ZrO_2$) with the balance made up of $SiO_2$ (generically referred to as "silicates"). In contrast, the glass films of the invention do not have to adhere to the stringent interfacial requirements of a CMOS device and as such they can employ oxides other than $SiO_2$. Such compositions lend themselves to enhanced dielectric characteristics applicable to DRAM storage devices.

As mentioned above, the implementation of a high-k material is desirable in integrated circuit technology, such as trench capacitor technology. Although there are numerous conventional materials from which to choose, most (e.g. $ZrO_2$, $HfO_2$) crystallize at temperatures below 1000° C. Because capacitor construction is a front end process, most high-k films will therefore devitrify (i.e., loose their amorphous structure and crystalize) and be susceptible to excessive electrical leakage and premature failure. It is important therefore to design a material with an appropriate dielectric constant which remains amorphous at temperatures up to (and in excess of) 1000° C. To that end, an atomic layer chemical vapor deposition (ALCVD) process is described here in which glass forming combinations of $La_2O_3$ and $Al_2O_3$ are deposited for use as a high-k dielectric in trench capacitor technologies.

Figure 1:
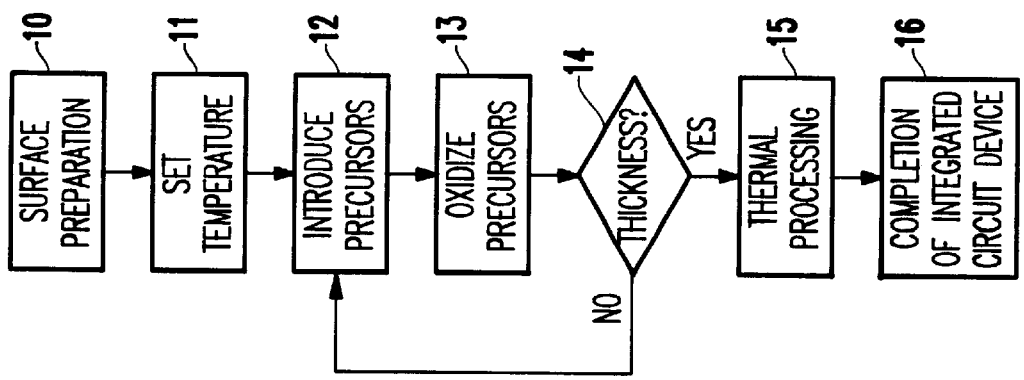
FIG. 1 is a flow diagram illustrating a preferred method of the invention.

More specifically, referring to the flowchart in FIG. 1 and schematic deposition chamber 22 in FIG. 2, a ALCVD deposition of $La_2O_3$—$Al_2O_3$ glasses is shown. In item 10, the surface of the material 20 on which the dielectric is to be formed (e.g., silicon substrate, integrated circuit, etc.) is prepared and cleaned. In such surface preparation, the invention terminates the substrate with Si—O bonds. SC1/SC2 or Huang A-B type cleans are examples of well-known processes that can be used here.

Precleans are typically used to remove residual organic materials from the surface or strip the native oxide that develops on wafer surfaces upon exposure to atmosphere. The surface treatment in the case described here prepares the surface with a fresh chemical oxide (Si—O bonds) thereby improving the deposition characteristics of the process and thus the electrical properties of the resultant film. There are extensive variations on surface pretreatments that might be employed and the SC1/Huang type mentioned above are meant to serve only as illustrations of applicable processes.

In item 11, the deposition chamber 22 is set to temperature less than 500° C. Typical ALCVD type processes utilizes wafer temperatures from 100–500° C. The temperature for each process is dependent upon the precursor materials used. It should be noted that there are variations on thermally driven ALD (i.e. the driving force for film deposition is the chemical reaction between precursor A and precursor B, which is strongly dependent on temperature) that serve to reduce the wafer temperature required, e.g. plasma enhanced ALD.

In item 12, the invention introduces precursors 24 (e.g., La, Al, Zr, Ta, Hf, Ti, etc.) into the deposition chamber. The precursors are introduced sequentially (i.e., an A-B-A-B type process) in background pressures of inert gas (N2 or Ar) on order of I Torr. Base pressures in the chamber prior to starting film deposition are $\sim 1 \times 10^{-6}$ Torr.

When introducing the precursors, it is important that the ratio of cations be consistent with glass formation. Historically, there are mixtures of oxides which resist crystallization to high temperatures. Deviations from these glass forming compositions results in the formation of crystalline phases. Based on the phase diagrams for the oxides of interest in this invention therefore ($La_2O_3$, $ZrO_2$, $HfO_2$, $TiO_2$, $Ta_2O_5$, $SiO_2$, $Al_2O_3$, etc.) there are observed a number of glass forming regions. As an example, recent work has been conducted on the $La_2O_3$, $Al_2O_3$ and $SiO_2$ glasses. As reported by Caurant et al. (Eur. J. Solid State Inorg. Chem., V. 30, 1993, 307–34 and V. 29, 1992, 1205–1215) the glassy phase in the $Al_2O_3$—$La_2O_3$ system extends roughly from 80% to 50% $Al_2O_3$ (the balance $La_2O_3$). Additional work conducted more recently by Weber et al. (J. Am. Ceram. Soc., 83, 1868–1872, 2000) is consistent with that range and reports glass formation at 60 mol % $Al_2O_3$ and 40 mol % $La_2O_3$. The addition of more components to the mix is sometimes desired to increase the temperature stability, adjust chemical behavior, or engineer the optical properties of glasses. In such a case (e.g., via the addition of $SiO_2$) the molar ratios will change (e.g., N. Clayden et al., J. Non-Crystalline Solids, V. 258, 1999, 11–19) and such changes would be reflected in synthesis of the DRAM dielectric.

The chamber is preferably purged with an inert gas (such as N2) between pulses of the precursor material. In item 13, the inventive process oxidizes the precursors (a commonly used oxidant is water vapor, ozone, nitric oxide, nitrous oxide etc.) and the invention allows the oxidation reaction to proceed to completion.

As shown in item 14, the inventive process then checks to see if the oxidized film 24 has achieved the necessary thickness. If not, the processing in items 12 and 13 is repeated until the film has achieved the necessary thickness. Typical thicknesses will likely range from 20–200 A.

Next, in item 15, a rapid thermal processing (RTP) is performed in the chamber 22 in an inert ($N_2$, Ar) or oxidizing ($O_2$, $N_2O$, NO, $H_2O$) ambient to homogenize the composition. The invention then cools the chamber 22 in a process that avoids crystallization of the glass 24. In the inventive process, the homogenization temperature is expected to be between 500° C.–1000° C. Critical cooling rates (the minimum rate at which a glass must be cooled to remain amorphous) are dependent upon a material's composition and typically fall between 25° C.–50° C./min.

Finally, the remaining conventional processes necessary to complete the remaining integrated circuit chip device are preformed in item 16. Further, the processing described above can be supplemented with any additional processing required by specific structures. For example, if items 20, 24 are a deep trench storage array, the substrate 20 may be patterned with deep trenches before the formation of the dielectric 24 and a conductor would fill the trenches above the dielectric 24. Therefore, while the schematic diagram in FIG. 2 merely represents a cross-sectional view of two surfaces 20, 24, as would be known by one ordinarily skilled in the art, such a drawing actually represents any type of integrated circuit device ranging from a small capacitor, to an entire integrated circuit chip. Such processing is well-known to those ordinarily skilled in the art and will not be discussed in detail herein, or shown in the drawings, so as to not unnecessarily obscure the salient features of the invention.

While an ALCVD process is discussed above for the synthesis of $La_2O_3$—$Al_2O_3$ based glass films, the inventive process is not limited to atomic layer techniques. Both metalorganic CVD (MOCVD) and chemical solution deposition (CSD) are alternative methods capable of depositing films with the desired composition that work well with the invention. For example, films with approximate compositions of 84 mol % aluminum oxide and 16% lanthanum oxide can be deposited on single crystal silicon substrates. X-ray diffraction can be used to characterize the films as a function of annealing temperature. An important feature of the invention is that the dielectric material remains amorphous at temperatures up to (and sometimes slightly in excess of) 1100° C.

The invention described above can also be modified to accommodate specific structures. For example, with respect to deep trench storage structures, although an extensive number of high-K dielectric material candidates exists (e.g. $TiO_2$, BSTO, $Ta_2O_5$, etc.), there are two primary criteria which must be satisfied prior to integration in deep trench capacitors. The first is that the material must conform to the shape of the trench and the second is thermal stability. Both $La_2O_3$ and $Al_2O_3$ can be conformally deposited by ALCVD. By engineering the exposure times (i.e. the pulse lengths) or delivery mechanism 12 of the precursors 24, different cation ratios can be achieved and the required glass forming compositions deposited.

Aside from the conformality requirements, and because of the elevated temperatures of subsequent front end processes (>1000° C.), alternative storage dielectrics must not react with, or diffuse into, the silicon trench on which they are deposited. Both $Al_2O_3$ and $La_2O_3$ are chemically stable in contact with silicon to 1000° C. Furthermore, mixtures of the two oxides remain vitreous to temperatures well in excess of 1100° C.

With the invention, the dielectric constant of the material 24 is increased when compared to conventional NO insulators. For example, NO has a k of 4; $ZrO_2$ and $HfO_2$ have a k of 20, BSTO has a k of 200. The k of the inventive $La_2O_3$—$Al_2O_3$ is greater than 10 and is approximately 20. Further, the inventive films remain amorphous at temperatures up to 1000° C. (and above). Other high dielectric materials crystallize at temperatures less than 1000° C., which leads to unwanted electrical leakage and reliability problems.

The invention also promotes enhanced scaleability because the inventive film composition can be changed with each generation to decrease EOT (equivalent oxide thickness) and maintain physical thickness. Therefore, with the invention, the learning gained from previous generations is not completely lost. The film composition (i.e. the ratio of cations to anions in the films) as well as the thickness can be continually adjusted to increase the dielectric constant, in turn decreasing the EOT and allowing continued use of the material for several generations. This avoids having to completely replace the dielectric material with a new high-k material as the scaling generations progress. High-k materials with set ratios can only be scaled in thickness, not composition.

Upon development of processes to synthesize the glass films used in this application, those processes and materials sets might find use in other aspects of microelectrics. For example, the wet and dry etch characteristics might be changed via an adjustment of the molar ratios of the constituent oxides. Changes in glass composition might also find utility in lithographic applications where changes in the refractive index and optical absorption are important. In such a case changing the film's composition might lead to desired lithographic performance. Additional use might be realized in back-end passive applications where dielectric materials are used in the construction of both capacitors and resistors.

While the invention has been described in terms of preferred embodiments, those skilled in the art will recognize that the invention can be practiced with modification within the spirit and scope of the appended claims.

What is claimed is:

1. A process of forming a high-k dielectric in an integrated circuit structure comprising:
   introducing precursors on said substrate in an atomic level chemical vapor deposition that comprises between 20%–50% $La_2O_3$ and 80%–50% $Al_2O_3$;
   oxidizing said precursors; and
   heating said precursors,
   wherein said introducing and said oxidizing of said precursors is preformed in a manner so as to form an amorphous glass dielectric on said substrate.

2. The process in claim 1, wherein said introducing of said precursors is performed in molar ratios consistent with formation of dielectric glass films.

3. The process in claim 1, wherein said introducing of said precursors comprises an atomic level chemical vapor deposition of $La_2O_3$ and $Al_2O_3$.

4. The process in claim 1, further comprising, before said introducing of said precursors on said substrate, cleaning said substrate.

5. The process in claim 1, wherein said introducing and said oxidizing of said precursors produces a dielectric that remains amorphous up to 1000° C.

6. The process in claim 1, wherein said introducing and said oxidizing of said precursors produces a dielectric that has a dielectric constant of approximately 20.

7. A process of forming an insulator for a deep trench capacitor in an integrated circuit structure comprising:
   forming deep trenches in a substrate
   introducing precursors on said substrate in an atomic level chemical vapor deposition that comprises between 20%–50% $La_2O_3$ and 80%–50% $Al_2O_3$;
   oxidizing said precursors; and
   heating said precursors,
   wherein said introducing and said oxidizing of sad precursors is preformed in a manner so as to form an amorphous glass dielectric on said substrate.

8. The process in claim 7, wherein said introducing of said precursors is performed in molar ratios consistent with formation of dielectric glass film.

9. The process in claim 7, wherein said introducing of said precursors comprises an atomic level chemical vapor deposition of $La_2O_3$ and $Al_2O_3$.

10. The process in claim 7, further comprising, before said introducing of said precursors on said substrate, cleaning said substrate.

11. The process in claim 7, wherein said introducing and said oxidizing of said precursors produces a dielectric that remains amorphous up to 1000° C.

12. The process in claim 7, wherein said introducing and said oxidizing of said precursors produces a dielectric that has a dielectric constant of approximately 20.

* * * * *

UNITED STATES PATENT AND TRADEMARK OFFICE
CERTIFICATE OF CORRECTION

PATENT NO.    : 6,541,331 B2
DATED         : April 1, 2003
INVENTOR(S)   : Clevenger et al.

It is certified that error appears in the above-identified patent and that said Letters Patent is hereby corrected as shown below:

<u>Column 6,</u>
Line 32, change "sad" to -- said --.

Signed and Sealed this

Seventeenth Day of June, 2003

JAMES E. ROGAN
*Director of the United States Patent and Trademark Office*